United States Patent [19]
Scepanovic et al.

[11] Patent Number: 5,838,585
[45] Date of Patent: Nov. 17, 1998

[54] PHYSICAL DESIGN AUTOMATION SYSTEM AND METHOD USING MONOTONICALLY IMPROVING LINEAR CLUSTERIZATION

[75] Inventors: Ranko Scepanovic; James S. Koford, both of San Jose, Calif.; Valeriy B. Kudryavtsev; Stanislav V. Aleshin, both of Moscow, Russian Federation; Alexander E. Andreev, Moskovskaja Oblast, Russian Federation; Alexander S. Podkolzin, Moscow, Russian Federation

[73] Assignee: LSI Logic Corporation, Milpitas, Calif.

[21] Appl. No.: 986,753

[22] Filed: Dec. 8, 1997

Related U.S. Application Data

[63] Continuation of Ser. No. 410,049, Mar. 24, 1995, abandoned.

[51] Int. Cl.$^6$ .................................................. G06F 17/50

[52] U.S. Cl. ........................... 364/491; 364/489; 364/490

[58] Field of Search .................................. 364/488–491, 364/378

[56] References Cited

U.S. PATENT DOCUMENTS

| | | | |
|---|---|---|---|
| 4,577,276 | 3/1986 | Dunlop et al. | 364/491 |
| 4,811,237 | 3/1989 | Putatunda et al. | 364/491 |
| 4,858,143 | 8/1989 | Fournier | 364/491 |
| 5,404,313 | 4/1995 | Shiohara et al. | 364/491 |
| 5,416,720 | 5/1995 | Fukui | 364/489 |
| 5,491,641 | 2/1996 | Scepanovic et al. | 364/491 |
| 5,552,722 | 9/1996 | Kean | 326/41 |
| 5,568,636 | 10/1996 | Koford | 395/500 |

OTHER PUBLICATIONS

Jürgen M. Kleinhans, Georg Sigl, Frank M. Johannes and Kurt J. Antreich; GORDIAN: VLSI Placement by Quadratic Programming and Slicing Optimization; IEEE Transactions on Computer–Aided Design, vol. 10, No. 3, Mar. 1991, pp. 356–365.

B. W. Kernighan and S. Lin; An Efficient Heuristic Procedure for Partitioning Graphs; The Bell System Technical Journal, Feb. 1970, pp. 291–307.

*Primary Examiner*—Vincent N. Trans
*Assistant Examiner*—Phallaka Kik
*Attorney, Agent, or Firm*—Mitchell, Silberberg & Knupp LLP

[57] ABSTRACT

An initial placement of cells, and a routing including wires interconnecting the cells, is provided for a microelectronic integrated circuit. A grid is defined as including a plurality of first gridlines that extend parallel to a first axis, and a plurality of second gridlines that extend parallel to a second axis that is angularly displaced from the first axis. The cells are represented as vertices located at intersections of first and second gridlines, and the wires are represented as edges that extend along the first and second gridlines. Clusters of vertices are created such that each cluster includes vertices located on a respective first gridline. A "cover" is computed as including a minimum block of clusters that are connected to all other clusters by wires extending along the second gridlines. Clusters outside the cover are spatially reordered along the second axis away from the cover in descending order of numbers of wires extending from the clusters along the second gridlines. The placement is then updated and rerouted, and these operations are performed in the opposite direction and the two perpendicular directions. A quality factor, preferably the total wirelength of the routing, is computed and compared to a previous value. The entire operation is iteratively performed until the improvement in quality factor between consecutive iterations becomes less than a predetermined value. Due to the nature of the reordering, the quality factor improves monotonically for each iteration. The rerouting steps can be omitted, and edges defined by bounding boxes constructed around interconnect nets.

35 Claims, 15 Drawing Sheets

|    | C1 | C2 | C3 | C4 | C5 | C6 | C7 | C8 | C9 | C10 | C11 | C12 | C13 | C14 |
|----|----|----|----|----|----|----|----|----|----|-----|-----|-----|-----|-----|
| P1 | 1  | 0  | 1  | 0  | 0  | 0  | 0  | 0  | 0  | 1   | 0   | 0   | 0   | 1   |
| P2 | 0  | 0  | 1  | 0  | 0  | 0  | 0  | 0  | 0  | 0   | 1   | 0   | 0   | 0   |
| P3 | 0  | 0  | 0  | 1  | 0  | 1  | 0  | 1  | 0  | 0   | 1   | 1   | 0   | 0   |
| P4 | 1  | 1  | 0  | 1  | 1  | 1  | 1  | 0  | 1  | 0   | 0   | 0   | 0   | 1   |
| P5 | 0  | 0  | 0  | 0  | 0  | 0  | 0  | 0  | 0  | 0   | 0   | 0   | 0   | 0   |
| P6 | 0  | 0  | 0  | 0  | 1  | 0  | 1  | 0  | 1  | 0   | 0   | 1   | 1   | 0   |
| P7 | 0  | 1  | 0  | 0  | 0  | 0  | 0  | 0  | 0  | 1   | 0   | 0   | 1   | 0   |

| P1 | C2 | C4 | C5 | C6 | C7 | C8 | C9 | C11 | C12 | C13 |
|----|----|----|----|----|----|----|----|-----|-----|-----|
|    | 0  | 1  | 0  | 0  | 0  | 0  | 0  | 0   | 0   | 0   |

M=(P,C)

| P3 | 0 | 1 | 0 | 1 | 0 | 1 | 0 | 1 | 1 | 0 |
| P5 | 1 | 0 | 0 | 1 | 0 | 0 | 0 | 0 | 0 | 0 |
| P6 | 0 | 0 | 1 | 0 | 1 | 0 | 1 | 0 | 1 | 1 |

|    | C1 | C2 | C3 | C4 | C5 | C6 | C7 | C8 | C9 | C10 | C11 | C12 | C13 | C14 |
|----|----|----|----|----|----|----|----|----|----|-----|-----|-----|-----|-----|
| P1 | 1  | 0  | 1  | 0  | 0  | 0  | 0  | 0  | 0  | 1   | 0   | 0   | 0   | 1   |
| P3 | 0  | 0  | 0  | 1  | 0  | 1  | 0  | 1  | 0  | 0   | 1   | 1   | 0   | 0   |

| B | | C1 | C2 | C3 | C4 | C5 | C6 | C7 | C8 | C9 | C10 | C11 | C12 | C13 | C14 |
|---|---|---|---|---|---|---|---|---|---|---|---|---|---|---|---|
| (4) | P1 | 1 | 0 | 1 | 0 | 0 | 0 | 0 | 0 | 0 | 1 | 0 | 0 | 0 | 1 |
| (1) | P2 | 0 | 0 | 1 | 0 | 0 | 0 | 0 | 0 | 0 | 0 | 1 | 0 | 0 | 0 |
| (4) | P3 | 0 | 0 | 0 | 1 | 0 | 1 | 0 | 1 | 1 | 0 | 1 | 1 | 0 | 0 |
| (2) | P4 | 1 | 0 | 0 | 1 | 1 | 0 | 0 | 1 | 0 | 0 | 0 | 0 | 0 | 1 |
| (1) | P5 | 0 | 1 | 0 | 0 | 0 | 1 | 0 | 0 | 1 | 0 | 0 | 0 | 0 | 0 |
| (2) | P6 | 0 | 0 | 0 | 0 | 1 | 0 | 1 | 0 | 0 | 0 | 0 | 1 | 1 | 0 |
| (0) | P7 | 0 | 1 | 0 | 0 | 0 | 0 | 1 | 0 | 0 | 1 | 0 | 0 | 1 | 0 |

| B | | C1 | C2 | C3 | C4 | C5 | C6 | C7 | C8 | C9 | C10 | C11 | C12 | C13 | C14 |
|---|---|----|----|----|----|----|----|----|----|----|-----|-----|-----|-----|-----|
| (4) | P1 | 1 | 0 | 1 | 0 | 0 | 0 | 0 | 0 | 0 | 1 | 0 | 0 | 0 | 1 |
| (1) | P2 | 0 | 0 | 1 | 0 | 0 | 0 | 0 | 0 | 0 | 0 | 1 | 0 | 0 | 0 |
| (4) | P3 | 0 | 0 | 0 | 1 | 0 | 1 | 0 | 1 | 0 | 0 | 1 | 1 | 0 | 0 |
| (2) | P4 | 1 | 0 | 0 | 0 | 1 | 0 | 0 | 1 | 1 | 0 | 0 | 0 | 0 | 1 |
| (2) | P5 | 0 | 1 | 0 | 0 | 0 | 1 | 1 | 0 | 0 | 0 | 0 | 0 | 0 | 0 |
| (1) | P6 | 0 | 0 | 0 | 0 | 1 | 0 | 0 | 0 | 1 | 0 | 0 | 1 | 1 | 0 |
| (0) | P7 | 0 | 1 | 0 | 0 | 0 | 0 | 1 | 0 | 0 | 1 | 0 | 0 | 1 | 0 |

PHYSICAL DESIGN AUTOMATION SYSTEM AND METHOD USING MONOTONICALLY IMPROVING LINEAR CLUSTERIZATION

BACKGROUND OF THE INVENTION

This application is a continuation of U.S. application Ser. No. 08/410,049, filed Mar. 24, 1995, now abandoned.

1. Field of the Invention

The present invention generally relates to the art of microelectronic integrated circuits, and more specifically to a physical design automation system and method for improving a cell placement and routing for an integrated circuit chip using monotonically improving linear clusterization.

2. Description of the Related Art

Microelectronic integrated circuits include a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Each microelectronic circuit cell includes a plurality of pins or terminals, each of which is connected to pins of other cells by a respective electrical interconnect wire network or net. A goal of the optimization process is to determine a cell placement and routing such that all of the required interconnects can be made, and the total wirelength and interconnect congestion are minimized.

There are two basic placement methodologies based on clusterization that are known in the prior art.

1. GORDIAN based methods which actually perform clusterization into a given number of clusters using the concept of a cluster gravity point, as described in an article entitled "GORDIAN: VLSI Placement by Quadratic Programming and Slicing Optimization", by J. Kleinhans et al, in IEEE Trans. on CAD, Vol. 10, No. 3, March 1991, pp. 356–365.

2. Min-cut based methods such as described in an article entitled "An Efficient Heuristic Procedure for Partitioning Graphs", by B. Kernighan and S. Lin, in Bell System Technical Journal, 49(2), February 1970, pp. 291–307.

The main disadvantage of these methods is that they lose some important characteristics of the hypergraph (netlist) due to coarse approximation of total wirelength and other factors. As a result, a clustering optimization performed using these methods does not necessarily imply the improvement of an initial placement.

SUMMARY OF THE INVENTION

In accordance with a method performed by a physical design automation system of the present invention, an initial placement of cells, and a routing including wires interconnecting the cells, is provided for a microelectronic integrated circuit.

A grid is defined as including a plurality of first gridlines that extend parallel to a first axis, and a plurality of second gridlines that extend parallel to a second axis that is angularly displaced from the first axis. The cells are represented as vertices located at intersections of first and second gridlines, and the wires are represented as edges that extend along the first and second gridlines.

Clusters of vertices are created such that each cluster includes vertices located on a respective first gridline. A "cover" is computed as including a minimum block of clusters that are connected to all other clusters by wires extending along the second gridlines.

Clusters outside the cover are spatially reordered along the second axis away from the cover in descending order of numbers of wires extending from the clusters along the second gridlines.

The placement is then updated and rerouted, and these operations are performed in the opposite direction and the two perpendicular directions.

A quality factor, preferably the total wirelength of the routing, is computed and compared to a previous value. The entire operation is iteratively performed until the improvement in quality factor between consecutive iterations becomes less than a predetermined value.

Due to the nature of the reordering, the quality factor improves monotonically for each iteration, and the size of the problem is reduced from dimension N to dimension $\sqrt{N}$.

In an alternative embodiment, the routing steps are omitted, and edges are defined by constructing bounding boxes around nets of vertices.

A significant advantage of the present method as compared to the existing methods is that clusterization improvement necessarily implies hypergraph placement improvement. Yet another advantage is simplicity in clusterization and the possibility of starting from an arbitrary placement.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 10 to 16 are incident matrices illustrating cluster cover computation and reordering in one direction;

DETAILED DESCRIPTION OF THE INVENTION

Figure 1:
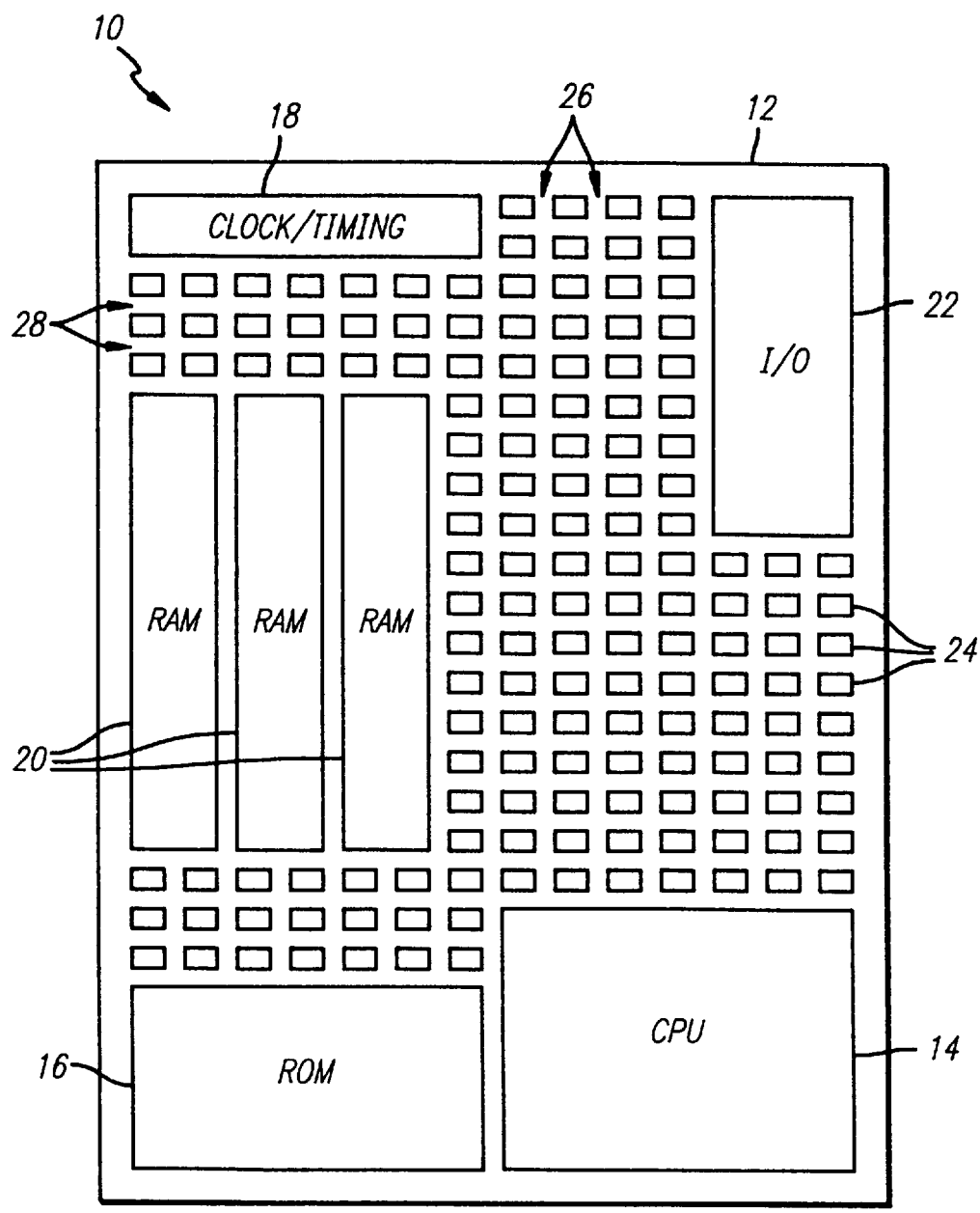
FIG. 1 is a simplified diagram illustrating a conventional rectilinear integrated circuit interconnect arrangement.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
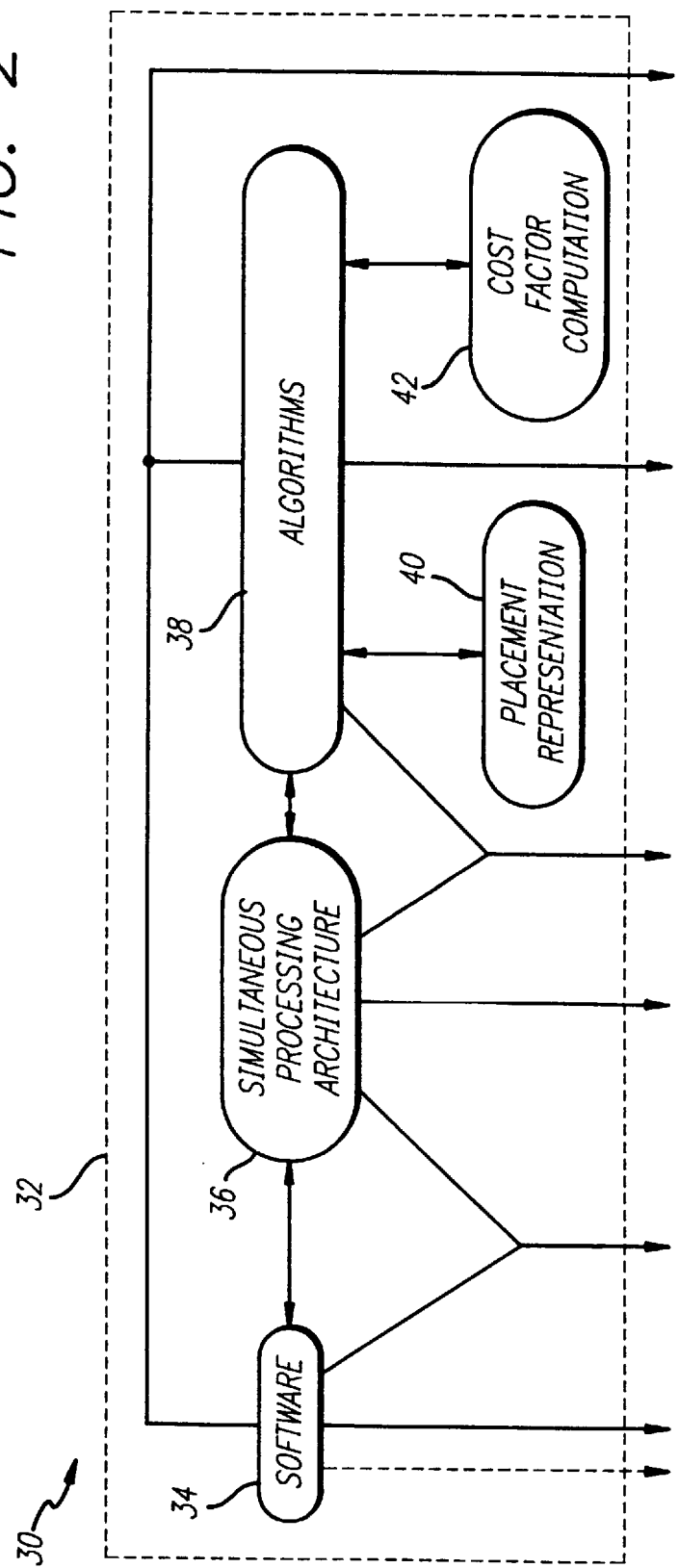
FIG. 2 is a block diagram illustrating a physical design automation system embodying the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement and routing that satisfy a predetermined performance objective.

The optimal cell placement and routing produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or algorithms 38 for placement, routing and measuring the relative fitnesses of cell placements and optimizing the fitnesses. Implementation of the algorithms 38 is facilitated by a cell placement representation 40 and cost function or quality factor computation 42. The architecture 36 can be of any type, such as Distributed Shared Memory (DSM), that enables parallel processing in accordance with the method of the invention.

The architecture 36 collectively implements the functions of a definition means, representation means, clusterization means, expansion means, computing means, reordering means, updating means and control means by assigning different parallel processors to perform these functions and combining the results thereof as will become evident from the following description.

Figure 3:
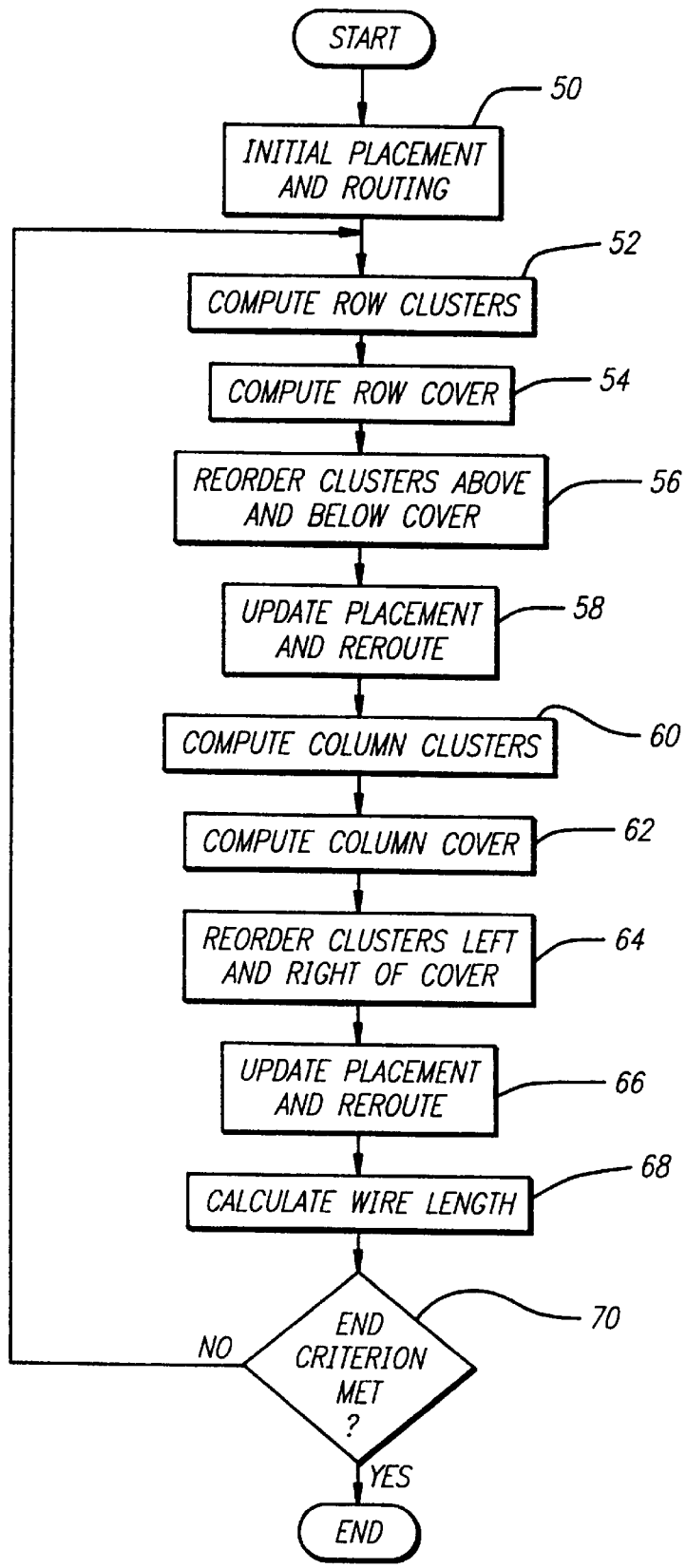
FIG. 3 is a flowchart illustrating a method of improving a cell placement and routing for a microelectronic integrated circuit that is performed by the system of FIG. 2.

The general outline of the present method is illustrated in flowchart form in FIG. 3. A first step, designated by the reference numeral 50, is to provide an initial placement and routing for a microelectronic integrated circuit as a function of the specified cells, netlist and other constraints.

The initial placement and can be produced by any appropriate methodology, such as the GORDIAN method discussed above.

The initial routing can be performed using any conventional means. As an alternative, the routing step can be omitted, and bounding boxes constructed around the nets as will be described below.

Next, as indicated at 52, a rectilinear grid system is defined, and clusters of cells are constructed as including the cells in respective rows. A "cover" is then computed in a step 54 which consists of the minimum block or smallest subset of clusters that includes vertical connections to all cells in the placement.

In the next step, designated as 56, the clusters above and below the cover are permuted or reordered in descending order of vertical connections such that the clusters with the largest number of connections are the closest to the cover. Then, in a step 58, the placement is updated to reflect the reordering in step 56, and a rerouting is optionally performed. The rerouting can be performed using any suitable routing methodology or commercially available router.

Next, as indicated at 60, clusters of cells are constructed as including the cells in respective columns. A cover is then computed in a step 62 which consists of the smallest subset of clusters that includes horizontal connections to all cells in the placement.

In the next step, designated as 64, the clusters leftward and rightward of the cover are reordered in descending order of horizontal connections such that the clusters with the largest number of connections are the closest to the cover. Then, in a step 66, the placement is updated to reflect the reordering in step 64, and is again rerouted.

The steps 60 to 66 are essentially similar to the steps 52 to 58, but are performed in the horizontal direction rather than the vertical direction.

Then, a quality factor of the placement and routing as improved by the method illustrated and described above is computed as indicated at 68. The quality factor is preferably the total wirelength of the placement, which is computed in a known manner, although the invention is not so limited.

In a step 70, the quality factor is compared with the previously computed value of the quality factor. If an end criterion is fulfilled, the process is terminated. If not, the steps 52 to 70 are repeated.

The end criterion is preferably such that the difference between the current quality factor and the quality factor for the previous iteration is smaller than a predetermined value, although the invention is not so limited. The steps 52 to 70 are repeated iteratively until the end criterion is fulfilled.

Generally, the method will produce large improvements in quality factor during the first few iterations, and the improvement will decrease progressively during later iterations. By using the quality factor difference as the end criterion, it is possible to end the process at a point at which continuation would not produce a commensurate improvement in placement quality.

Figure 4:
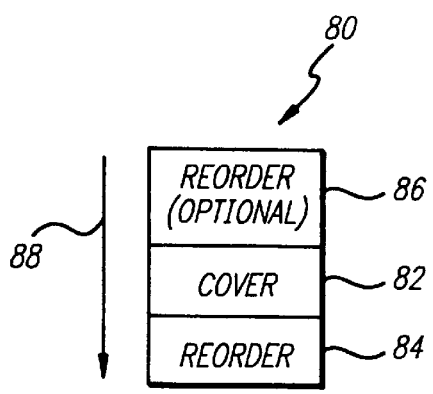
FIGS. 4 to 7 are diagrams illustrating the general methodology of the method.
Figure 5:
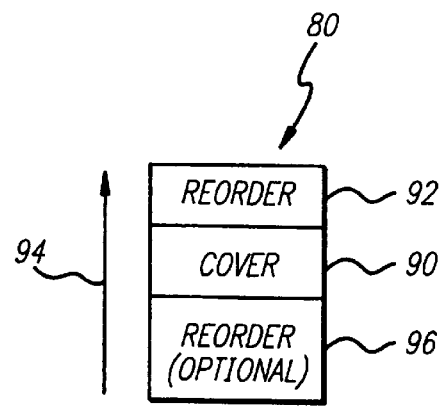

The sequence of steps of the present method is illustrated in more detail in FIGS. 4 to 7. FIGS. 4 and 5 illustrate the results of performing steps 52 to 56 for a microelectronic circuit 80. The individual cells, clusters and interconnecting wires are not explicitly shown in the drawings for simplicity of illustration.

In FIG. 4, a first cover 82 is computed, and the clusters below the cover 82 are reordered (rearranged in the vertical direction) as indicated at 84 such that the clusters with the largest numbers of vertical connections are located in the highest vertical positions (closest to the cover 82). The clusters are ordered from top down in descending order of numbers of vertical connections using any suitable sorting method.

Optionally, as indicated at 86, the clusters above the cover 82 can also be reordered in descending order of numbers of vertical connections from bottom up such that the clusters with the largest numbers of vertical connections are in the lowest vertical positions (closest to the cover 82).

In FIG. 4, the cover 82 is computed and the clusters below the cover at 84 are reordered in the downward direction as indicated by an arrow 88. In FIG. 5, a second cover 90 is computed from the bottom up, and the clusters above the cover 90 as indicated at 92 are reordered in the upward direction as indicated by an arrow 94. The reordering is again performed such that the clusters with the largest numbers of vertical connections are located closest to the cover 90 in descending order. Optionally, the clusters below the cover 90 can also be reordered as indicated at 96.

The placement of cells in the circuit 80 is then updated to reflect the operations of steps 52 to 56, and the placement is rerouted as described above in step 58.

Figure 6:
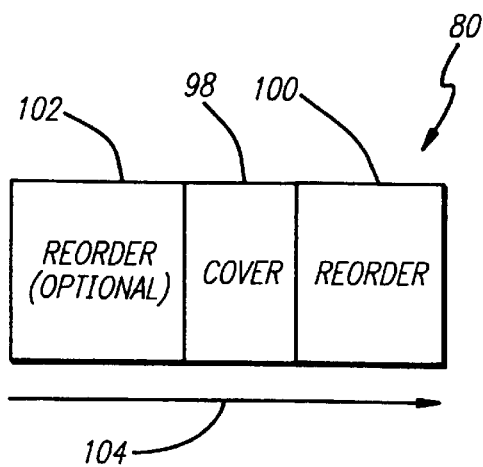
Figure 7:
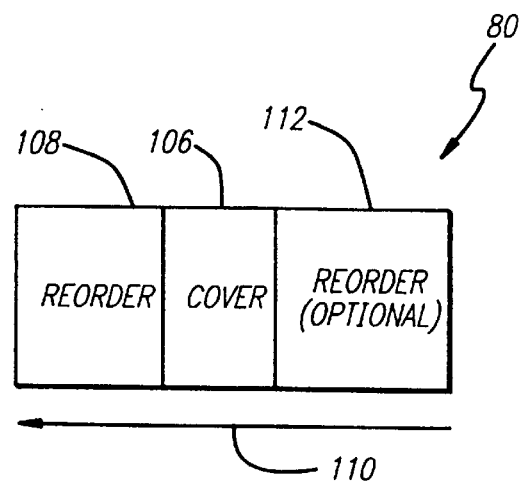

FIGS. 6 and 7 illustrate the results of performing steps 60 to 66. In FIG. 6, a third cover 98 is computed, and the clusters rightward of the cover 98 are reordered in the horizontal direction as indicated at 100 such that the clusters with the largest numbers of vertical connections are located in the leftmost horizontal positions. The clusters are ordered from left to right in descending order of numbers of horizontal connections.

Optionally, as indicated at 102, the clusters leftward of the cover 98 can also be reordered in descending order of numbers of horizontal connections from right to left such that the clusters with the largest numbers of vertical connections are closest to the cover 98.

In FIG. 6, the cover 98 is computed and the clusters rightward of the cover at 100 are reordered in the rightward direction as indicated by an arrow 104. In FIG. 7, a fourth cover 106 is computed from right to left, and the clusters leftward of the cover 106 as indicated at 108 are reordered in the leftward direction as indicated by an arrow 110. The reordering is again performed such that the clusters with the largest numbers of horizontal connections are located closest to the cover 106 in descending order. Optionally, the clusters rightward of the cover 106 can also be reordered as indicated at 112.

The placement of cells in the circuit 80 is then updated to reflect the operations of steps 60 to 64, and the placement is rerouted as described above in the step 66. The process is iterated until the end criterion is fulfilled as described with reference to steps 68 and 70.

Various modifications are possible to the method as described with reference to FIGS. 4 to 7. For example, the clusters 86 and 102 can be reordered in the steps of FIGS. 4 and 6 respectively, and the steps of FIGS. 5 and 7 can be omitted. Also, the covers 82, 90, 98 and 106 will probably include internal clusters (not shown) that are not necessary for complete connection to all clusters in the circuit 80. In such a case, these internal clusters can be moved out of the covers prior to the reordering steps. For example, in FIG. 4, an internal cluster that is not needed to provide the cover can be moved above or below the cover 82 depending on whether it is above or below the vertical center of the cover 82 respectively.

A simplified example of applying the steps 52 to 56 of the present method as illustrated in FIG. 4 for computing the clusters and the cover 82, and reordering the clusters below the cover 82 in the area 84, is illustrated in FIGS. 8 to 17. It will be understood that the operations in the other directions as illustrated in FIGS. 5 to 7 are essentially similar, and will not be described repetitiously.

In the following description, the steps will be defined succinctly using mathematical set theory, and also described qualitatively with reference to the figures of drawing.

The initial placement and routing is provided as indicated in step 50. More formally, a given placement of the hypergraph $H=(A,Q)$ is assumed, where A is set of vertices (cells) and Q is set of hyperedges (nets), on a rectilinear grid or lattice $R = \{(i,j)|(i,j-\text{integers} \leq N)\}$. In this manner, a graph $G=(V,E)$ is defined, where $V \subseteq R$ is a set of vertices of G and E is a set of edges such that for each hyperedge $q \epsilon Q$ and each pair of vertices $a_1, a_2$ from q, there exists a path in G which connects $a_1$ and $a_2$.

In general, the cell specifications and the netlist are represented as the hypergraph H, in which the hyperedges Q designate interconnections but not any specific interconnection geometry. The initial routing transforms the hypergraph H into the graph G in which the nets are specified in the form of minimum Steiner trees, stars, etc. in a known manner.

A rectilinear distance is defined on G; i.e., if vertices $(i_1, j_1)$ and $(i_2, j_2)$ are connected with an edge in G, the length of the edge is equal to $$|i_1-i_2|+|j_1-j_2|.$$

Figure 8:
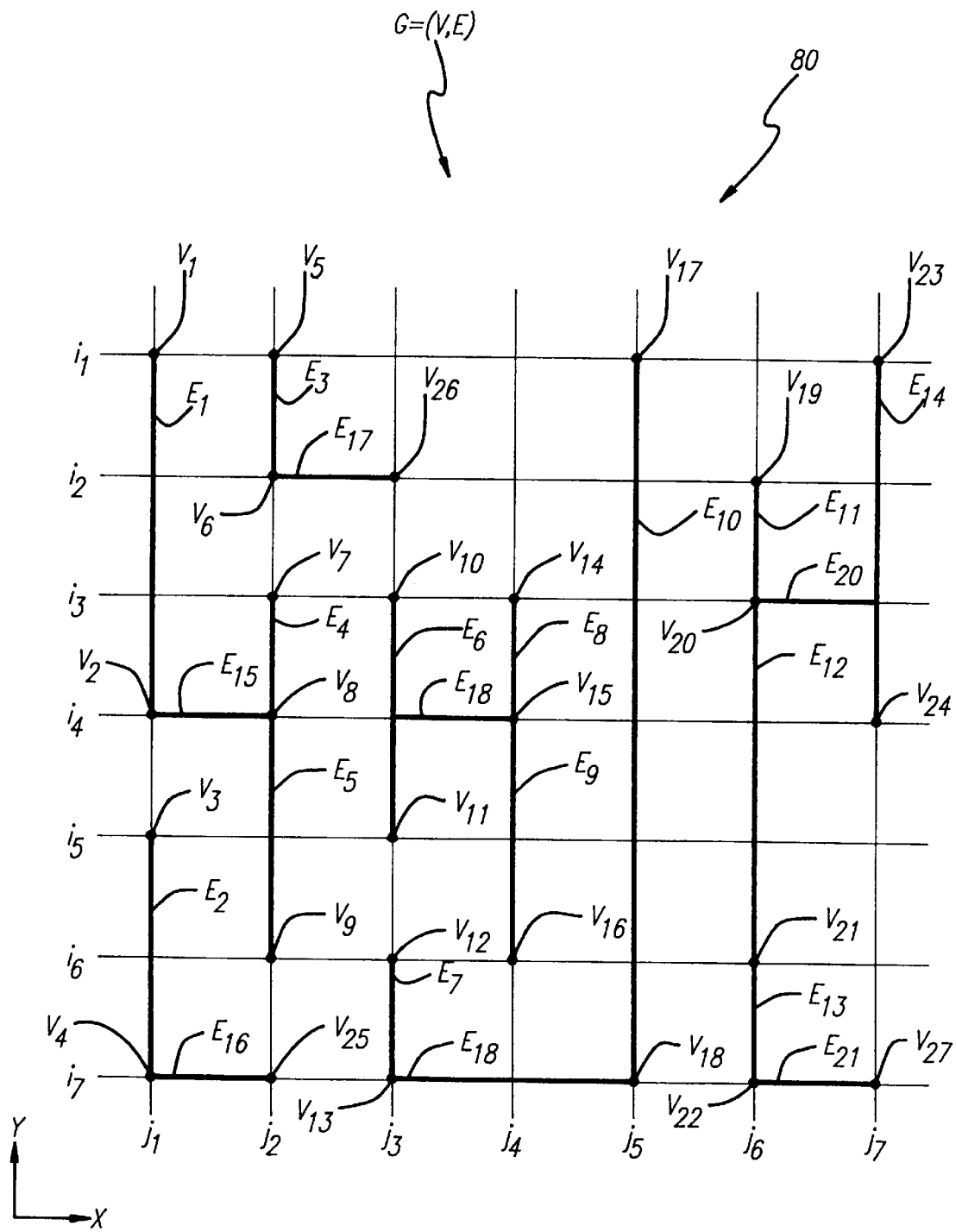
FIG. 8 is a diagram illustrating an initial integrated circuit placement and routing represented as a graph on a rectilinear grid.

In FIG. 8, the rectilinear grid includes first gridlines $i_1$ to $i_7$ that extend parallel to a first axis (horizontal or x) to define rows, and second gridlines $j_1$ to $j_7$ that extend parallel to a second axis (vertical or y) to define columns. The individual cells of the circuit 80 are represented as vertices $v_1$ to $v_{27}$ of the graph G that are located at the intersections of the gridlines $i_1$ to $i_7$ and $j_1$ to $j_7$. The cells (vertices) $v_1$ to $v_{27}$ are connected by routing wires that are represented as edges $E_1$ to $E_{21}$ that extend along the gridlines.

Figure 9:
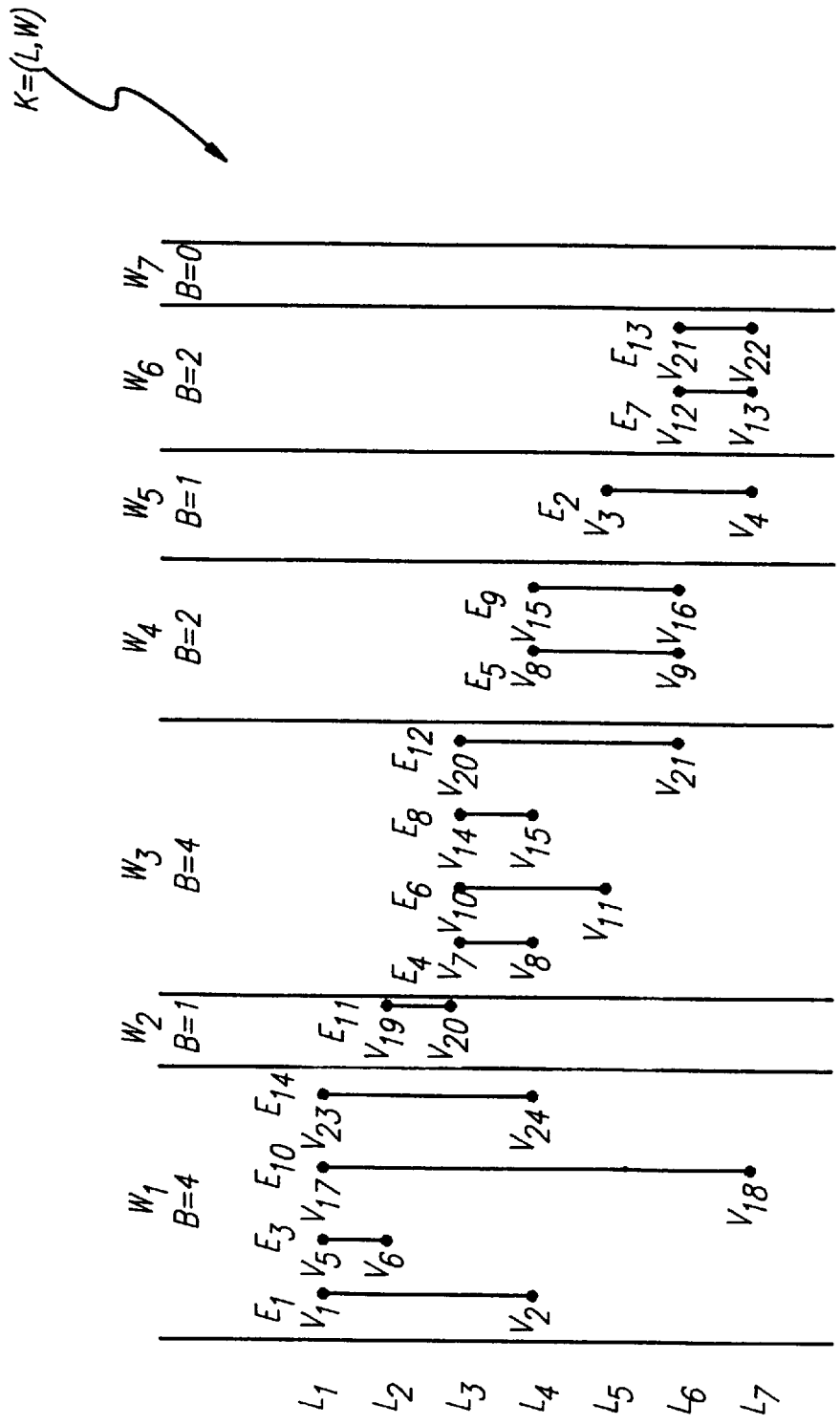
FIG. 9 is a diagram illustrating clusterization of the graph of FIG. 8.

The row clusterization step 52 is illustrated in FIG. 9. A row is defined as a set $$L_i = \{(i,j), j=1, 2, \cdots N\}.$$

An i-th cluster is defined as including all vertices in the i-th row.

Denote by K=(L,W) a graph of clusters, where L={$L_i$} is a set of clusters $L_i$ that include vertices in respective rows that are connected to vertices in lower rows, and W is set of edges {$W_i$} such that vertices in clusters $L_i$, $L_j$ are connected with an edge in K if there exist a pair of vertices $v_1$, $v_2$ in the Graph G, $v_1 \epsilon L_i$, $v_2 \epsilon L_j$, which are connected with an edge in G. Denote by $t_{i,j}$ a number of edges in G whose one end point belongs to $L_i$ and the other one to $L_j$.

As illustrated in FIG. 9, a cluster $L_1$ for the first row consists of vertices $v_1$, $v_5$, $v_{17}$ and $v_{23}$. The vertex $v_1$ is connected to the vertex $v_2$ by a vertical edge $E_1$, the vertex $v_5$ is connected to the vertex $v_6$ by a vertical edge $E_3$, the vertex $v_{17}$ is connected to the vertex $v_{18}$ by a vertical edge $E_{10}$ and the vertex $v_{23}$ is connected to the vertex $v_{24}$ by a vertical edge $E_{14}$. The set $W_1$ of edges therefore consists of the edges $E_1$, $E_3$, $E_{10}$ and $E_{14}$.

Similarly, the cluster $L_2$ and set of edges $W_2$ consist of the vertex $v_{19}$ and the edge $E_{11}$ respectively. The cluster $L_3$ consists of the vertices $v_7$, $V_{10}$, $V_{14}$ and $v_{20}$, whereas the set of edges $W_3$ consists of the edges $E_4$, $E_6$, $E_8$ and $E_{12}$. The other clusters and sets of edges are determined in the same manner.

Figure 10:

As illustrated in FIG. 10, an incident matrix M=(P,C) of the graph K is constructed, consisting of a matrix of 0's and 1's whose rows correspond to vertices of K and columns to edges of K such that $m_{i,j}$=1 if the vertex with index i belongs to the edge with index j. For example, the vertex $v_1$ in the cluster $P_1$ is connected to the vertex $v_2$ in the cluster $P_4$ by the edge $E_1$ in the column $C_1$. Therefore, the entries in the incident table of FIG. 11 for the coordinates $P_1,C_1$ and $P_4,C_4$ are "1", whereas all other entries in the column $C_1$ are "0".

The incident matrix of FIG. 10 includes a column for each vertical edge. However, the matrix can be simplified by omitting duplications in cases where two clusters are connected by more than one edge. This would enable the edges $E_1,E_{14}$, $E_5,E_9$ and $E_7,E_{13}$ to each be represented by one column.

The step 54 of computing the cover 82 using a greedy algorithm is illustrated in FIGS. 11 to 14. The cover of rows of matrix M is selected to cover at least one 1 from each column of M, i.e., the set of rows P={$S_{i_1},S_{i_2} \ldots S_{i_j}$}, such that for each column $C_s$ there is a row $S_{i_j}$ of matrix M from P such that $M_{i,s}$=1.

The greedy algorithm can be expressed mathematically as follows.

1. For each row with index 1 greater than $i_r$ compute a cluster weighting factor $B_1$ (as illustrated in FIG. 9) such that $$B_l = \sum_{i=1}^{N} t_{li}$$

2. Permute rows with indices greater than $i_r$ in the order of descending row weighting factors.

3. Starting from the row with index N choose the minimum number of consecutive rows with indices N,N−1, . . . until the cover of M is obtained.

The cluster with the largest number of vertices connected to vertices in lower clusters is chosen as an "anchor" to which all other clusters in the cover will be connected. As illustrated in FIGS. 9 and 11, the clusters $L_1$ and $L_3$ each include four vertices (B=4). In such a case, an additional criterion is used to "break the tie". For example, as illustrated, the cluster with the highest vertical position ($L_1$) will be chosen as the anchor cluster.

The cluster $L_1$ is connected by vertical wires (edges) to clusters in lower vertical positions in the columns $C_1$, $C_3$, $C_{10}$ and $C_{14}$. Therefore, these columns are deleted from the incident matrix.

Then, the clusters that are connected to the anchor cluster $L_1$ by edges in the deleted columns are also deleted from the incident matrix. These clusters are $P_2$ (via edge $E_3$), $P_4$ (via edges $E_1$ and $E_{14}$), and $P_7$ (via edge $E_{10}$). As a result, the incident matrix has been reduced to the form illustrated in FIG. 12.

Figure 13:
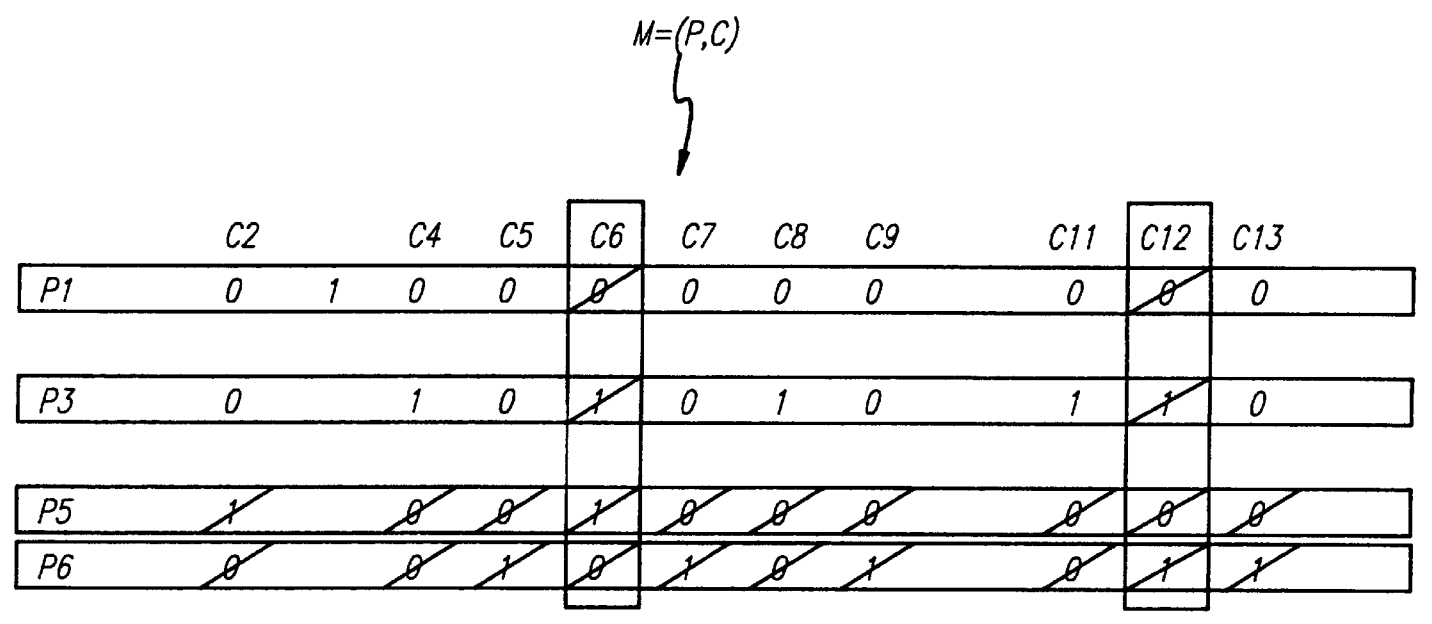

Then, the cluster with the next highest number of vertices connected to vertices in lower clusters is determined, in this case the cluster $P_3$ as illustrated in FIG. 13. The cluster $P_3$ is connected to remaining vertices in clusters in lower vertical positions in column $C_6$ (edge $E_6$ connects vertex $v_{10}$ to vertex $v_{11}$ in cluster $P_5$), and column $C_{12}$ (edge $E_{12}$ connects vertex $v_{20}$ to vertex $v_{21}$ in cluster $P_6$) Columns $C_6$ and $C_{12}$ are therefore deleted, as well as clusters $P_5$ and $P_6$ to which they are connected.

The result of this operation is illustrated in FIG. 14, in which the function of the cover 82 is provided by the clusters $P_1$ and $P_3$ since all other clusters have been eliminated.

Although cluster $P_2$ is located between clusters $P_1$ and $P_3$ and is not necessary to provide the cover, it can be left in position to simplify subsequent processing. Alternatively, it can be permuted out of the cover (in this case above the cover), and the cluster $P_1$ or $P_3$ shifted vertically such that they are vertically adjacent with no intervening unnecessary clusters as described above.

The step 56 of reordering the clusters below the cover 82 as illustrated in FIG. 4 is further illustrated in FIG. 15. The numbers in parenthesis to the left of the cluster numbers P are the weighting factors B which denote the number of vertices in the respective clusters that are connected to clusters in lower vertical positions. The factors B for the clusters $P_4$, $P_5$, $P_6$ and $P_7$ are (2), (1), (2) and (0) respectively.

The relative positions of the clusters $P_4$ and $P_7$ are as desired, since $B_4$ is larger than $B_7$. However, the cluster $P_5$ that contains only one vertex is closer to the cover 82 than is the cluster $P_6$ that contains two clusters, this ordering is not as desired. Thus, the reordering is performed such that the relative order of the clusters $P_5$ and $P_6$ is reversed, and the cluster $P_6$ is brought closer to the cover 82 than the cluster $P_5$ as illustrated in FIG. 16.

Although only two clusters are illustrated as being reordered in the simplified example described above, the principle is the same for any number of clusters. The reordering is performed such that the clusters are rearranged in descending order of weighting factor B, and the clusters with the highest weighting factor B are the closest to the cover.

Figure 17:
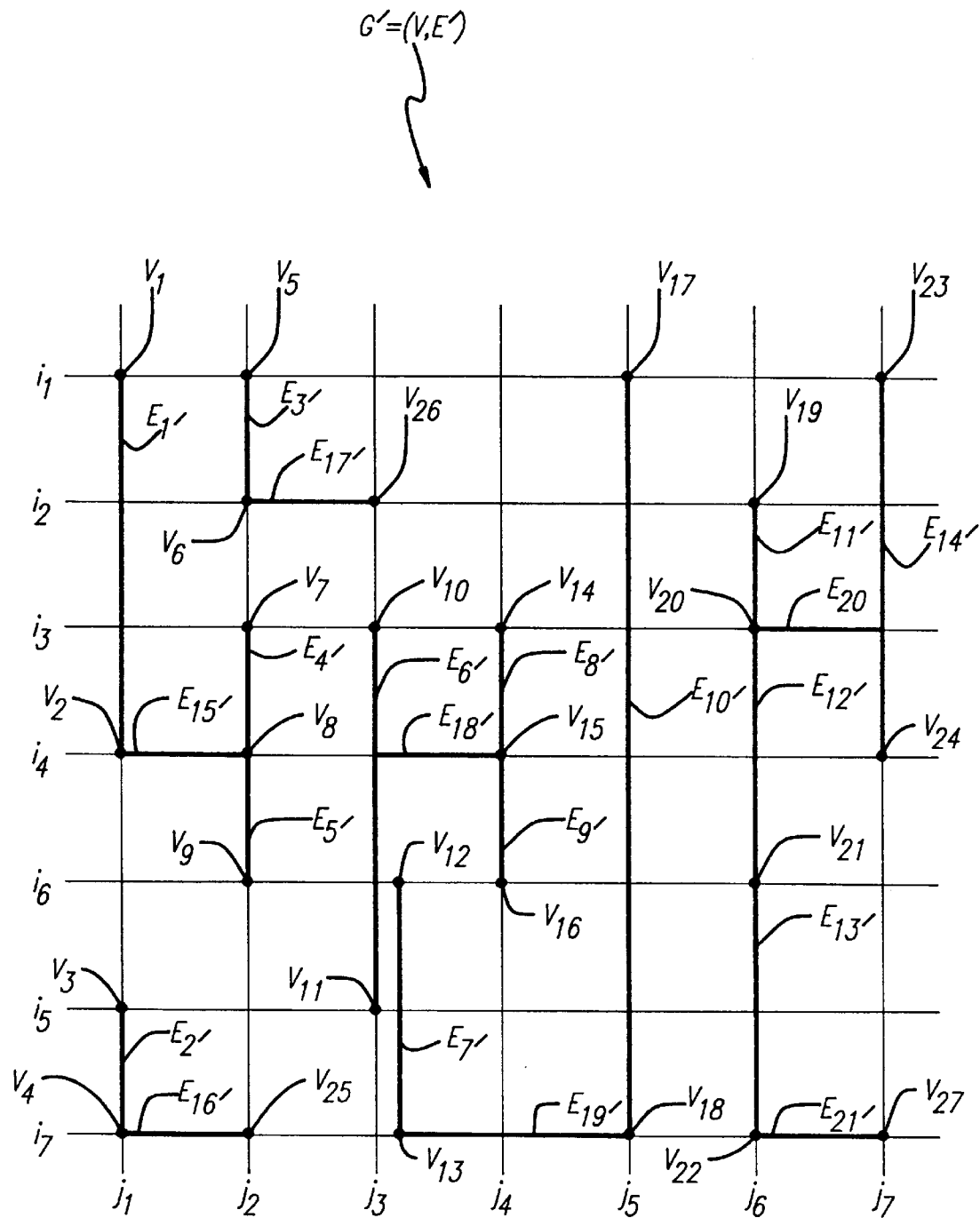
FIG. 17 is similar to FIG. 8, but illustrates an improved placement produced by the method steps illustrated in FIGS. 10 to 16.

The reordering will decrease the lengths of some of the wires (edges), while increasing the lengths of others. The illustrated example produces a graph G'=(V,E') as illustrated in FIG. 17 having a total wirelength which is less than the total wirelength of the graph G of FIG. 8. Assuming that the spacings of the vertical and horizontal gridlines are the same, and that the distance between two gridlines has a value of unity, the wirelengths of the graphs G and G' are given in the following table.

| EDGE | OLD LENGTH | NEW LENGTH | CHANGED |
|---|---|---|---|
| $E_1$ | 3 | 3 | N |
| $E_2$ | 2 | 1 | Y |
| $E_3$ | 1 | 1 | N |
| $E_4$ | 1 | 1 | N |
| $E_5$ | 2 | 1 | Y |
| $E_6$ | 2 | 3 | Y |
| $E_7$ | 1 | 2 | Y |
| $E_8$ | 1 | 1 | N |
| $E_9$ | 2 | 1 | Y |
| $E_{10}$ | 6 | 6 | N |
| $E_{11}$ | 1 | 1 | N |
| $E_{12}$ | 3 | 2 | Y |
| $E_{13}$ | 1 | 2 | Y |
| $E_{14}$ | 3 | 3 | N |
| TOTAL | 29 | 28 | Y |

As will be seen from the table, the lengths of the edges $E_2$, $E_5$, $E_9$ and $E_{12}$ were each decreased by one increment, whereas the lengths of the edges $E_6$, $E_7$ and $E_{13}$ were each increased by one increment. The total wirelength of the circuit 80 was thereby reduced from 29 increments to 28 increments by the illustrated operations.

The placement is then updated in step 58 to reflect the reordering described above in step 56. This is done by denoting the achieved reordering of rows with $\pi$, i.e., the row that had index i before executing of step 56 has index $\pi(i)$ after step 58.

Then, according to the achieved reordering $\pi$, vertices of G are permuted onto the lattice R and the vertices (cells) (i,j) are placed on the grid intersections $(\pi((i),j))$. In this manner, each vertex a of the hypergraph H is assigned to a lattice or grid node.

The re-routing of step 58 is preferably performed in a known manner by finding a minimum rectilinear spanning tree for each hyperedge $q \in Q$. This produces a new graph G.

Due to the nature of the reordering, the quality factor (total wirelength or other parameter) improves monotonically for each iteration. More precisely, the present method reduces the size of the problem from dimension N to dimension $\sqrt{N}$.

A significant advantage of the present method as compared to the existing methods is that clusterization improvement necessarily implies hypergraph placement improvement. Yet another advantage is simplicity in clusterization and the possibility of starting from an arbitrary placement.

Figure 18:
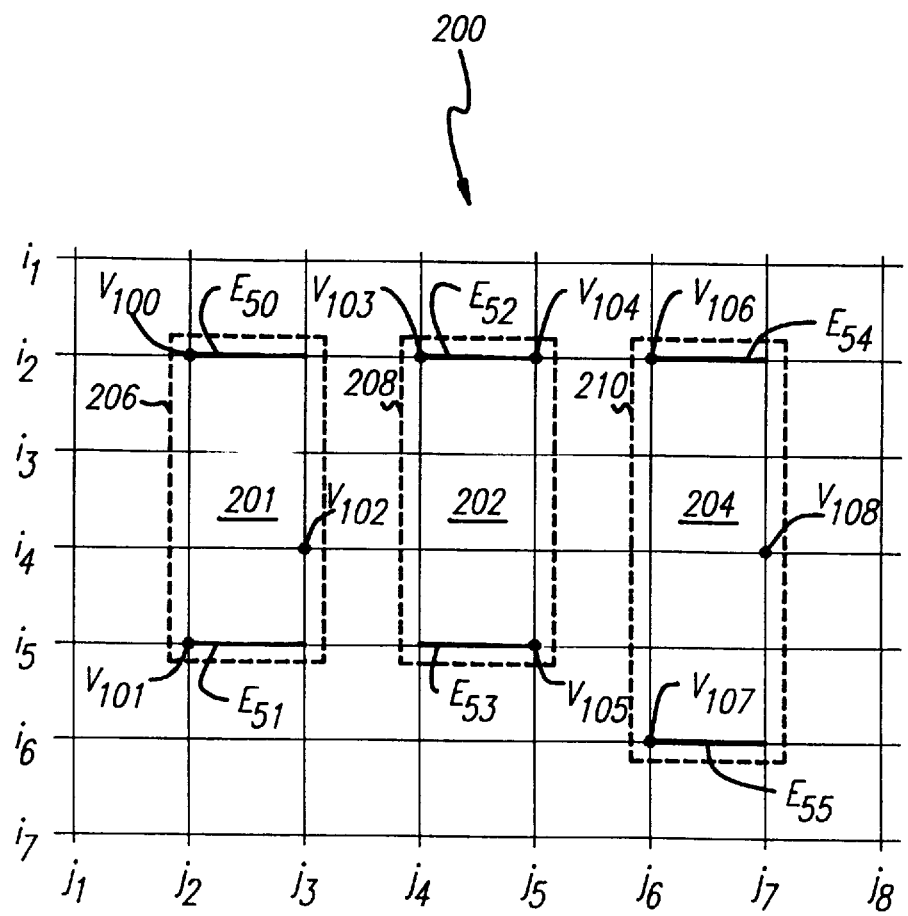
FIG. 18 is a diagram illustrating how edges are defined by bounding boxes constructed around interconnect nets rather than by routing.

An alternative embodiment of the invention is illustrated in FIG. 18, in which the above described routing steps are omitted. Instead, "bounding boxes" are constructed around the nets of the placement, and the edges of the bounding boxes are used for determining horizontal and vertical edges between vertices.

A microelectronic circuit 200 comprises a first net 201 including pins (vertices) $V_{100}$, $V_{101}$ and $V_{102}$, a second net 202 including vertices $V_{103}$, $V_{104}$ and $V_{105}$, and a third net 204 including vertices $V_{106}$, $V_{107}$ and $V_{108}$.

Bounding boxes 206, 208 and 210 are constructed around the nets 201, 202 and 204 respectively. Although the bounding boxes are shown in the drawing as being spaced around the nets, this is merely for clarity of illustration, and the edges of the bounding boxes actually coincide with the gridlines. For example, an upper edge $E_{50}$ of the bounding box 206 lies on the horizontal gridline $i_2$ and extends between the vertical gridlines $j_2$ and $j_3$.

The bounding boxes 208 and 210 also have upper edges $E_{52}$ and $E_{54}$ which lie on the gridline $i_2$. The bounding boxes 206 and 208 have lower edges $E_{51}$ and $E_{53}$ which lie on the gridline $i_5$, whereas the bounding box 210 has a lower edge which lies on the gridline $i_6$.

Rather than being defined by routing wires as described above, vertical edges of clusters are defined by horizontal edges of the bounding boxes. The bounding boxes 201 and 202 each have horizontal edges which lie on the gridlines $i_2$ and $i_5$. This implies a vertical edge for each bounding box 201 and 202 extending between the gridlines $i_2$ and $i_5$.

$T_{ij}$ is defined as the number of bounding boxes whose horizontal edges lie in rows i and j. $T_{ij}=2$ for the combination of the bounding boxes 201 and 202.

The bounding box 204 has an upper edge on the gridline $i_2$ and a lower edge on the gridline $i_6$. Therefore, $T_{ij}=1$. The cover is computed and the clusters are reordered in the manner described above for the case in which rerouting is performed.

Various modifications will become possible for those skilled in the art after receiving the teachings of the present disclosure without departing from the scope thereof.

We claim:

1. A method of improving a placement of cells, and a routing including wires interconnecting said cells, for a microelectronic integrated circuit, the method comprising the steps of:
    (a) defining a grid including a plurality of first gridlines that extend parallel to a first axis, and a plurality of second gridlines that extend parallel to a second axis that is angularly displaced from said first axis;
    (b) representing said cells as vertices located at intersections of said first and second gridlines;
    (c) representing said wires as edges that extend along said first and second gridlines;
    (d) creating clusters of vertices such that each cluster includes vertices located on a respective first gridline;
    (e) computing a cover as including a minimum block of clusters that are connected to all other clusters by said wires extending along said second gridlines; and
    (f) spatially reordering clusters outside said cover along said second axis in accordance with a predetermined reordering function.

2. A method as in claim 1, in which said second axis perpendicular to said first axis.

3. A method as in claim 1, in which said first gridlines constitute rows and said second gridlines constitute columns.

4. A method as in claim 1, in which said first gridlines constitute columns and said second gridlines constitute rows.

5. A method as in claim 1, in which said predetermined reordering function comprises reordering said clusters in order of numbers of said wires connected thereto that extend along said second gridlines.

6. A method as in claim 5, in which said predetermined reordering function comprises reordering said clusters away from said cover in descending order of said numbers of wires.

7. A method as in claim 6, in which step (f) comprises reordering said clusters on opposite sides of said cover along said second axis.

8. A method as in claim 1, further comprising the steps of:
    (g) updating said placement and routing in accordance with said reordering performed in step (f) to produce an improved placement and routing;
    (h) computing a quality factor of said improved placement and routing;
    (i) repeatedly performing steps (b) to (h); and (j) terminating step (i) when said quality factor fulfills a predetermined criterion.

9. A method as in claim 8, in which said quality factor in step (h) comprises a total wirelength of said improved routing.

10. A method as in claim 8, in which said predetermined criterion in step (j) comprises a difference of less than a predetermined value between said quality factor and a previously computed quality factor.

11. A method as in claim 1, further comprising the steps, performed after step (f), of:
   (g) updating said placement in accordance with said reordering performed in step (f); and
   (h) rerouting said placement in accordance with a predetermined routing function.

12. A method as in claim 1, in which:
   step (f) comprises reordering said clusters that are outside said cover in a first direction along said axis; and
   the method further comprises the steps, performed after step (f), of:
      (g) computing a second cover as including a minimum block of clusters that are connected to all other clusters by said wires extending along said second gridlines; and
      (h) spatially reordering clusters that are outside said cover in a second direction which is opposite to said first direction along said second axis in accordance with said predetermined reordering function.

13. A method as in claim 12, in which:
   step (e) comprises computing said cover in said first direction; and
   step (h) comprises computing said second cover in said second direction.

14. A method as in claim 12, in which:
   said cover comprises a first cover step (f) further comprises reordering said clusters that are outside said cover in said second direction; and
   step (h) further comprises reordering said clusters that are outside said second cover in said first direction.

15. A method as in claim 12, further comprising the steps of:
   (i) computing a third cover as including a minimum block of clusters that are connected to all other clusters by said wires extending along said first gridlines;
   (j) spatially reordering clusters outside said cover in a third direction along said first axis in accordance with said predetermined reordering function;
   (k) computing a fourth cover as including a minimum block of clusters that are connected to all other clusters by said wires extending along said first gridlines; and
   (l) spatially reordering clusters that are outside said cover in a fourth direction that is opposite to said third direction along said first axis in accordance with said predetermined reordering function.

16. A method as in claim 1, in which said wires are defined by edges of bounding boxes surrounding nets of vertices respectively.

17. A physical design automation system for improving a placement of cells, and a routing including wires interconnecting said cells, for a microelectronic integrated circuit, the system comprising:
   definition means for defining a grid as including a plurality of first gridlines that extend parallel to a first axis, and a plurality of second gridlines that extend parallel to a second axis that is angularly displaced from said first axis;
   representation means for representing said cells as vertices located at intersections of said first and second gridlines, and representing said wires as edges that extend along said first and second gridlines;
   clusterization means for creating clusters of vertices such that each cluster includes vertices located on a respective first gridline;
   cover computing means for computing a cover as including a minimum block of clusters that are connected to all other clusters by said wires extending along said second gridlines; and
   reordering means for spatially reordering clusters outside said cover along said second axis in accordance with a predetermined reordering function.

18. A system as in claim 17, in which said second axis is perpendicular to said first axis.

19. A system as in claim 17, in which said first gridlines constitute rows and said second gridlines constitute columns.

20. A system as in claim 17, in which said first gridlines constitute columns and said second gridlines constitute rows.

21. A system as in claim 17, in which said predetermined reordering function comprises reordering said clusters in order of numbers of said wires connected thereto that extend along said second gridlines.

22. A system as in claim 21, in which said predetermined reordering function comprises reordering said clusters away from said cover in descending order of said numbers of wires.

23. A system as in claim 22, in which the reordering means reorders said clusters on opposite sides of said cover along said second axis.

24. A system as in claim 17, further comprising:
   updating means for updating said placement and routing in accordance with said reordering performed by the reordering means to produce an improved placement and routing;
   quality factor computing means for computing a quality factor of said improved placement and routing; and
   control means for repeatedly controlling operations of the representation means, the clusterization means, the cover computing means, the reordering means, the updating means and the quality computing means; and for terminating said operations when said quality factor fulfills a predetermined criterion.

25. A system as in claim 24, in which said quality factor comprises a total wirelength of said improved routing.

26. A system as in claim 24, in which said predetermined criterion comprises a difference of less than a predetermined value between said quality factor and a previously computed quality factor.

27. A system as in claim 17, further comprising:
   updating means for updating said placement in accordance with said reordering; and
   routing means for rerouting said placement in accordance with a predetermined routing function.

28. A system as in claim 17, in which:
   the reordering means reorders said clusters that are outside said cover in a first direction along said second axis;
   the cover computing means further computes a second cover as including a minimum block of clusters that are connected to all other clusters by said wires extending along said second gridlines; and the reordering means further spatially reorders clusters that are outside said cover in a second direction that is opposite to said first direction along said second axis in accordance with said predetermined reordering function.

29. A system as in claim 28, in which:

the cover computing means computes said cover in said first direction, and computes said second cover in said second direction.

30. A system as in claim 28, in which:

the reordering means further reorders said clusters that are outside said cover in said second direction, and reorders said clusters that are outside said second cover in said first direction.

31. A system as in claim 28, in which:

the cover computing means further computes a third cover as including a minimum block of clusters which are connected to all other clusters by said wires extending along said first gridlines;

the reordering means further spatially reorders clusters outside said cover in a third direction along said first axis in accordance with said predetermined reordering function;

the cover computing means further computes a fourth cover as including a minimum block of clusters that are connected to all other clusters by said wires extending along said first gridlines; and the reordering means further spatially reorders clusters that are outside said cover in a fourth direction that is opposite to said third direction along said first axis in accordance with said predetermined reordering function.

32. The system as in claim 17, in which said wires are defined by edges of bounding boxes surrounding nets of vertices respectively.

33. A method of improving a placement of cells and wires that interconnect said cells for an integrated circuit layout, comprising:

(a) defining a grid including a plurality of first gridlines that extend parallel to a first axis, and a plurality of second gridlines that extend parallel to a second axis that is angularly displaced from said first axis;

(b) representing said cells as vertices located at intersections of said first and second gridlines;

(c) representing said wires as edges that extend along said first and second gridlines;

(d) forming a first set of clusters of vertices such that each cluster includes vertices located on respective first gridlines;

(e) forming a cover as including a block of clusters that are connected to all other clusters by said wires extending along said second gridlines;

(f) spatially reordering clusters outside said cover according to the number of said wires connecting other clusters outside of said cover in order to improve said placement of cells; and (g) re-routing said interconnect wires in order to maintain the same interconnection of the placement of cells.

34. The method of claim 33, further including the steps of:

(h) forming a second set of clusters of vertices such that each cluster includes vertices located on respective second gridlines;

(i) forming a second cover as including a second block of clusters that are connected to all other clusters by said wires extending along said first gridlines;

(j) spatially reordering clusters outside said second cover according to the number of said wires connecting other clusters outside of said second cover in order to improve said placement of cells; and (k) re-routing said interconnect wires in order to maintain the same interconnection of the placement of cells.

35. The method of claim 33, further including the steps of:

calculating a first total wire length of said interconnect wires of said cell placement after performing said steps (a) through (k);

repeating steps (a) through (k);

calculating a second total wire length of said interconnect wires of said cell placement;

comparing said first total wire length with said second total wire length; and repeating said steps (a) through (k) if the difference between said first and second total wire lengths is not less than a pre-determined value.

* * * * *